(12) United States Patent
Ferri et al.

(10) Patent No.: US 9,577,423 B2
(45) Date of Patent: Feb. 21, 2017

(54) POWER SYSTEM INCLUDING A LOAD PANEL PROTECTING A FACILITY FROM A BROKEN OR MISSING NEUTRAL OF A SPLIT PHASE ELECTRICAL DISTRIBUTION CONFIGURATION

(71) Applicant: EATON CORPORATION, Cleveland, OH (US)

(72) Inventors: Vincent Ferri, Pittsburgh, PA (US); Garry B. Theadore, Beaver Falls, PA (US); Todd M. Lathrop, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 257 days.

(21) Appl. No.: 14/035,188

(22) Filed: Sep. 24, 2013

(65) Prior Publication Data

US 2014/0307353 A1    Oct. 16, 2014

Related U.S. Application Data

(63) Continuation-in-part of application No. 13/860,682, filed on Apr. 11, 2013, now Pat. No. 9,335,363.

(51) Int. Cl.
*H02H 3/32* (2006.01)
*H02H 3/33* (2006.01)
*H02H 5/10* (2006.01)
*G01R 31/02* (2006.01)

(52) U.S. Cl.
CPC ............ *H02H 3/325* (2013.01); *H02H 3/338* (2013.01); *H02H 5/105* (2013.01); *G01R 31/025* (2013.01)

(58) Field of Classification Search
CPC ................................ G01R 31/02; H02H 3/325
USPC ....................................... 361/42, 50; 324/537
See application file for complete search history.

(56) References Cited

U.S. PATENT DOCUMENTS

| | | | | |
|---|---|---|---|---|
| 5,517,381 | A | * | 5/1996 | Guim et al. .................. 361/102 |
| 5,889,643 | A | * | 3/1999 | Elms .................... H02H 1/0015 |
| | | | | 361/115 |
| 6,040,967 | A | | 3/2000 | Disalvo |
| 7,292,419 | B1 | * | 11/2007 | Nemir ............................ 361/42 |
| 7,440,250 | B2 | | 10/2008 | Terhorst |

(Continued)

OTHER PUBLICATIONS

Wikimedia Foundation, Inc., "Split-phase electric power", Wikipedia, http://en.wikipedia.org/wiki/Split-phase_electric_power, Mar. 7, 2013, 5 pp.

(Continued)

*Primary Examiner* — Jermele M Hollington
*Assistant Examiner* — Zannatul Ferdous
(74) *Attorney, Agent, or Firm* — Eckert Seamans; Nathaniel Wilks; Grant Coffield (57) ABSTRACT

A power system is for a facility. The power system includes a load panel powered from a split phase electrical distribution configuration having a first line, a second line and a neutral. A two-pole circuit interrupter in the load panel receives power from the first line, the second line and the neutral, and protects an unbalanced load. The two-pole circuit interrupter is structured to trip open or open responsive to an input. A circuit in the load panel is structured to determine that the neutral is broken or missing and responsively output to the input to cause the two-pole circuit interrupter to trip open or open.

19 Claims, 6 Drawing Sheets

(56) References Cited

U.S. PATENT DOCUMENTS

| | | |
|---|---|---|
| 7,518,840 B2 | 4/2009 | Elms |
| 7,554,319 B1* | 6/2009 | Li et al. ............... 324/121 R |
| 2003/0086224 A1* | 5/2003 | Elms et al. ............ 361/91.1 |
| 2010/0204933 A1* | 8/2010 | Lagree ................... 702/58 |
| 2010/0301883 A1* | 12/2010 | Meyers et al. ........... 324/705 |
| 2011/0074294 A1* | 3/2011 | Song et al. ............. 315/77 |
| 2012/0200300 A1* | 8/2012 | Lamb ................... 324/537 |
| 2014/0211345 A1* | 7/2014 | Thompson ........ B60L 11/1816 361/42 |

OTHER PUBLICATIONS

Ametek Programmable Power, "Common AC Power Distribution Configurations", http://www.programmablepower.com/support/FAQs/DF_AC_Distribution.pdf, Mar. 7, 2013, 9 pp.

* cited by examiner

POWER SYSTEM INCLUDING A LOAD PANEL PROTECTING A FACILITY FROM A BROKEN OR MISSING NEUTRAL OF A SPLIT PHASE ELECTRICAL DISTRIBUTION CONFIGURATION

CROSS-REFERENCE TO RELATED APPLICATION

This application is a continuation-in-part of U.S. patent application Ser. No. 13/860,682, filed Apr. 11, 2013, which is hereby incorporated by reference herein.

BACKGROUND

Field

The disclosed concept relates generally to power systems and, in particular, to power systems including a load panel in a split phase electrical distribution configuration.

Background Information

Split phase electrical distribution configurations are well known in the art. One known split phase electrical distribution configuration is the 120/240 single phase electrical distribution configuration shown in FIG. 1. The 120/240 single phase electrical distribution configuration is used in many residential and commercial applications in North America.

Figure 1:
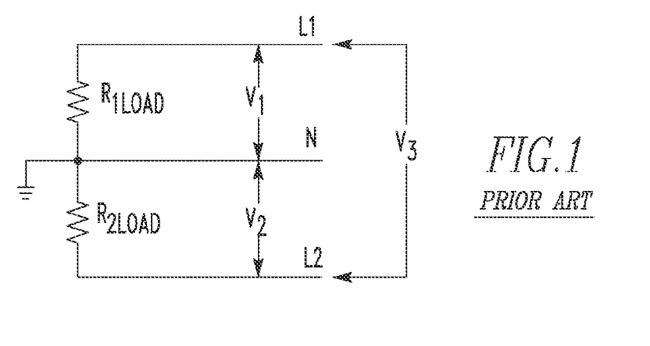
FIG. 1 is a circuit diagram of a split phase electrical distribution configuration.

Referring to FIG. 1, the 120/240 single phase electrical distribution configuration has first and second lines L1,L2 and a neutral N. In the 120/240 single phase electrical distribution configuration, the line-neutral voltages $V_1, V_2$ are 120V and the line-line voltage $V_3$ is 240V under normal operating conditions. A first facility load $R_{1LOAD}$ is electrically connected between the first line L1 and the neutral N and a second facility load $R_{2LOAD}$ is electrically connected between the second line L2 and the neutral N. The purpose of the neutral N is to maintain the equal voltages across the first and second facility loads $R_{1LOAD}, R_{2LOAD}$ regardless of whether the facility loads $R_{1LOAD}, r_{2LOAD}$ are unbalanced.

However, if the neutral N is broken or missing (e.g., damaged; disabled; high impedance), and the facility loads $R_{1LOAD}, R_{2LOAD}$ are unbalanced, then the voltages across the facility loads $R_{1LOAD}, R_{2LOAD}$ become unequal. The unequal voltages can create an overvoltage condition (e.g., without limitation, applying an excessive voltage to an appliance) which can damage equipment as well as create a dangerous situation. It would therefore be desirable to monitor the status of the neutral wire of a power system that relies upon a neutral return for proper operation if the neutral connection becomes broken or missing.

Furthermore, it would be desirable to protect the power system and equipment powered by the power system in the event that the neutral connection becomes broken or missing.

There is room for improvement in power systems.

SUMMARY

These needs and others are met by embodiments of the disclosed concept, which provide a circuit in a load panel structured to determine that a neutral is broken or missing and responsively output to cause a two-pole circuit interrupter in the load panel to trip open or open.

In accordance with the disclosed concept, a power system for a facility comprises: a load panel powered from a split phase electrical distribution configuration having a first line, a second line and a neutral; a two-pole circuit interrupter in the load panel receiving power from the first line, the second line and the neutral, and protecting an unbalanced load, the two-pole circuit interrupter being structured to trip open or open responsive to an input; and a circuit in the load panel structured to determine that the neutral is broken or missing and responsively output to the input to cause the two-pole circuit interrupter to trip open or open.

The two-pole circuit interrupter in the load panel may be a two-pole main circuit interrupter in the load panel; and the circuit in the load panel may be external to the two-pole main circuit interrupter in the load panel.

The two-pole circuit interrupter in the load panel may be a two-pole main circuit interrupter in the load panel; and the circuit in the load panel may be internal to the two-pole main circuit interrupter in the load panel.

The input of the two-pole main circuit interrupter may be a shunt trip input that causes the two-pole main circuit interrupter to trip open responsive to the neutral being broken or missing.

The two-pole circuit interrupter in the load panel may be a two-pole branch circuit interrupter in the load panel; and the circuit in the load panel may be external to the two-pole branch circuit interrupter in the load panel.

The two-pole circuit interrupter in the load panel may be a two-pole branch circuit interrupter in the load panel; and the circuit in the load panel may be internal to the two-pole branch circuit interrupter in the load panel.

The input of the two-pole branch circuit interrupter may be a shunt trip input or a remote control input that causes the two-pole branch circuit interrupter to trip open or open, respectively, responsive to the neutral being broken or missing.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "load panel" shall mean a load center, a panelboard, a circuit breaker panel, or any suitable enclosure enclosing or housing a number of electrical switching apparatus for a number of branch or other load circuits.

As employed herein, the term "facility" shall mean a building or other structure including a load panel that powers a number of branch or other load circuits from a power source. Non-limiting examples of facilities include a home, an apartment, a dwelling, an office building, a commercial building, an industrial building and/or a place where a person or persons reside(s) and/or work(s).

Figure 2:
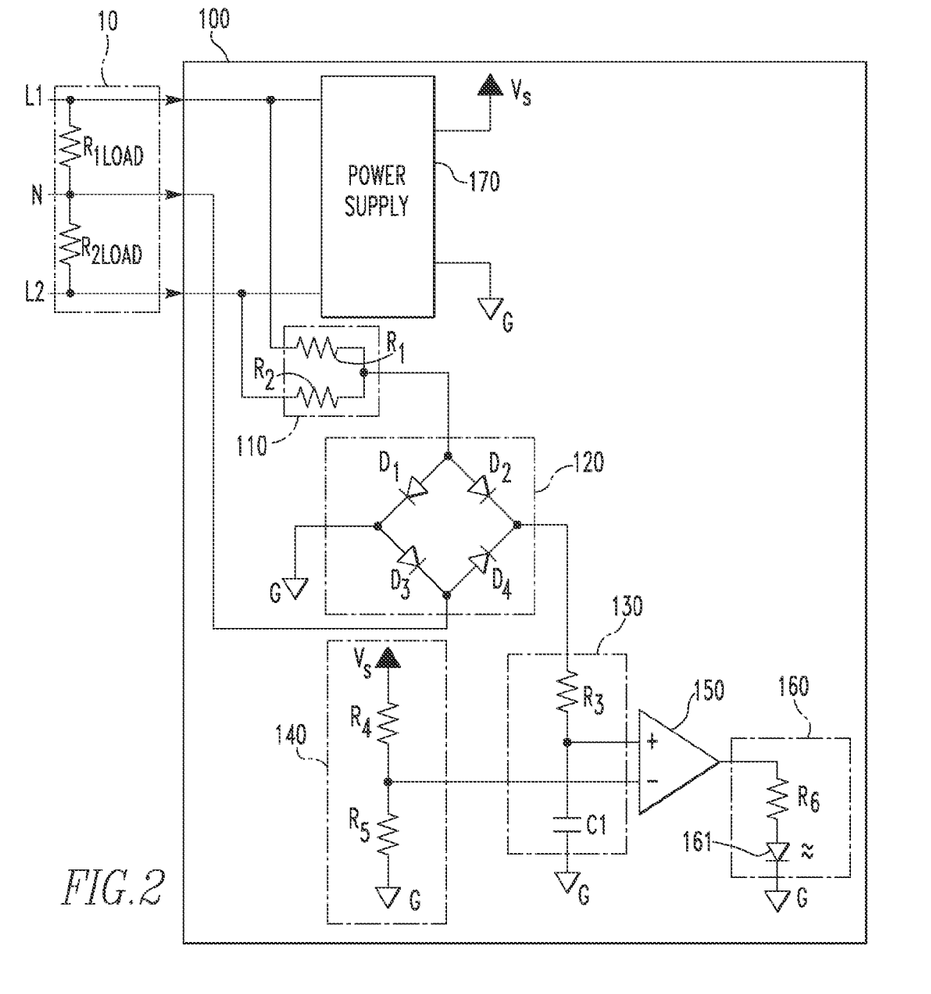
FIG. 2 is a circuit diagram of a monitoring circuit in accordance with an example embodiment of the disclosed concept.

Referring to FIG. 2, a split phase electrical distribution configuration (e.g., without limitation, a 120/240 single phase electrical distribution configuration) includes first and second lines L1,L2 and a neutral N. In the example split phase electrical distribution configuration, voltage provided by the first line L1 is 180 degrees out of phase with voltage provided by the second line L2. The electrical distribution configuration also includes a first facility load $R_{1LOAD}$ electrically connected between the first line L1 and the neutral N, and a second facility load $R_{2LOAD}$ electrically connected between the second line L2 and the neutral N. The first and second facility loads $R_{1LOAD}$,$R_{2LOAD}$ are located in a facility 10 (e.g., without limitation, a residential or commercial property).

A circuit 100 for indicating a broken or missing neutral is electrically connected to the first and second lines L1,L2 and the neutral N of the split phase electrical distribution configuration. The circuit 100 includes a voltage divider 110, a rectifier 120, a detection circuit having a filter 130, a reference voltage generator 140, and a comparator 150, an indicator circuit 160, and a power supply 170.

The voltage divider 110 is electrically connected to the first and second lines L1,L2 and is configured to divide a voltage difference between the first line L1 and the second line L2. The voltage divider 110 outputs the divided voltage difference as a virtual neutral. The voltage divider 110 includes first and second resistances R1,R2 which are substantially equal to each other, and the output of the voltage divider is provided from a point between the first and second resistances R1,R2. The first and second resistances R1,R2 being substantially equal causes the virtual neutral output from the voltage divider 110 to be an average of the voltage of the first line L1 and the voltage of the second line L2.

Voltages of the virtual neutral and the real neutral N are input into the rectifier 120. The rectifier 120 rectifies the voltage difference between the virtual neutral and the neutral N. When the voltages of the virtual neutral and the neutral N are equal, such as when the neutral N is present and unbroken, the output of the rectifier will be about 0V. However, when the neutral N is broken or missing and the facility loads $R_{1LOAD}$,$R_{2LOAD}$ are unbalanced, voltages of the virtual neutral and the neutral N will be different. The example rectifier 120 disclosed in FIG. 2 is a full-wave rectifier including first through fourth diodes D1,D2,D3,D4. However, it will be appreciated by those having ordinary skill in the art that any suitable rectifier circuit may be employed as rectifier 120.

The output of the rectifier 120 is provided to the determination circuit 130,140,150. The determination circuit 130,140,150 includes the filter 130, the reference voltage generator 140, and the comparator 150. The determination circuit 130,140,150 determines if the neutral N is broken or missing based on the rectified voltage difference between the virtual neutral and the neutral N, and the reference voltage. In more detail, the filter 130 receives and filters the rectified voltage difference output from the rectifier 120. The filter 130 provides the filtered rectified voltage difference to a first input (+) of the comparator 150. The example filter 130 includes a resistor R3 electrically connected between the output of the rectifier 120 and the first input of the comparator 150 and a capacitor C1 electrically connected between the first input of the comparator 150 and a ground. However, it will be appreciated by those having ordinary skill in the art that any suitable filtering circuit may be employed as filter 130 without departing from the scope of the disclosed concept.

The reference voltage generator 140 generates the reference voltage and provides it to a second input (−) of the comparator 150. The example reference voltage generator 140 includes two resistors R4,R5 arranged as a voltage divider configured to divide a direct current supply voltage $V_S$ to generate the reference voltage. However, it will be appreciated by those having ordinary skill in the art that any suitable mechanism or circuit for generating the reference voltage may be employed without departing from the scope of the disclosed concept. In some example embodiments of the disclosed concept, the reference voltage is in a range of about 2.5V to about 10V, but it will be appreciated that the disclosed concept is not limited thereto.

The comparator 150 receives and compares the filtered rectified voltage difference and the reference voltage. When the filtered rectified voltage difference is greater than the reference voltage, the determination circuit 130,140,150 determines that the neutral N is missing or broken and the comparator 150 provides a suitable output voltage to the indicator circuit 160.

When the indicator circuit 160 receives the suitable output voltage from comparator 150, the indicator circuit 160 provides an indication that the neutral N is broken or missing. In the example embodiment illustrated in FIG. 2, the indicator circuit 160 includes a resistor R6 and an indicator 161 (e.g., without limitation, a light emitting diode) that illuminates to indicate that the neutral is missing or broken. However, it will be appreciated that any suitable audible, visual or electrical indicator may be employed.

Figure 3:
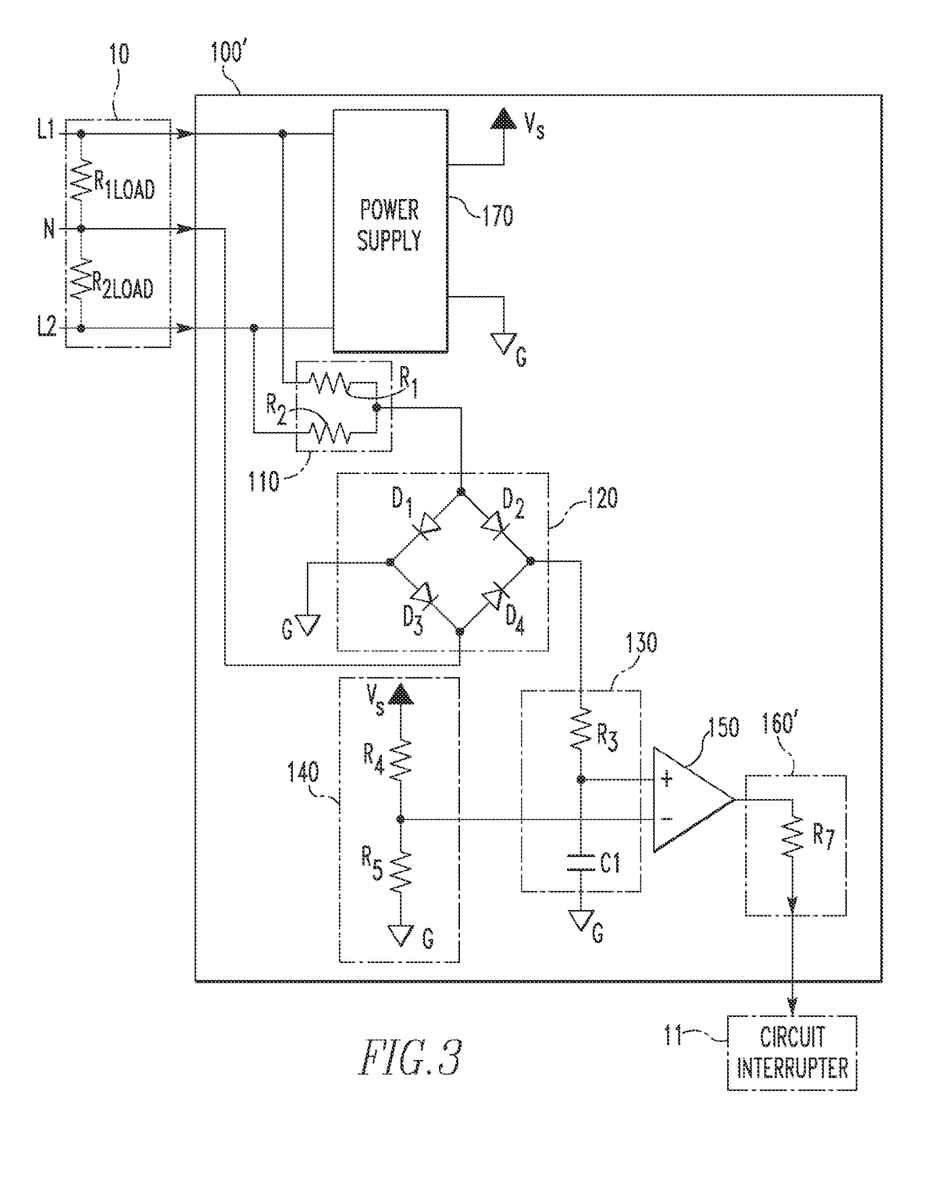
FIG. 3 is a circuit diagram a monitoring circuit in accordance with another example embodiment of the disclosed concept.

Referring to FIG. 3, another example of an indicator circuit 160' is shown with circuit 100'. Rather than using a light as an indication that the neutral N is broken or missing, the indicator circuit 160' provides a signal as the indication that the neutral N is broken or missing. The signal may be provided to, for example and without limitation, an external circuit interrupter 11. The external circuit interrupter 11 may use the signal to, for example and without limitation, trip one or more power circuits in the facility 10 to protect the facility 10 from unbalanced voltage conditions caused by the broken or missing neutral N.

Referring back to FIG. 2, the circuit 100 further includes a power supply 170. The power supply 170 is configured to use alternating current power from the first and second lines L1,L2 to create a direct current supply power $V_S$ and a ground G. The direct current supply power $V_S$ and the ground G are used by the determination circuit 130,140,150 to power the comparator 150 and to generate the reference voltage. The power supply 170 is not electrically connected to the neutral N, and thus the direct current supply power $V_S$ and ground G used in the circuit are not compromised when the neutral N is missing or broken.

As was described in connection with FIG. 3, the circuit interrupter 11 uses a signal from the neutral monitoring circuit 100' to, for example and without limitation, trip one or more power circuits in the facility 10 to protect the facility 10 from unbalanced voltage conditions caused by a broken or missing neutral N.

Although not shown, it will be appreciated that the circuits 160,160' can be combined such that there can be a suitable audible, visual or electrical indicator to indicate that the neutral is missing or broken, along with the circuit interrupter 11 to trip one or more power circuits in the facility 10 to protect the facility 10 from unbalanced voltage conditions caused by the broken or missing neutral.

Figure 4:
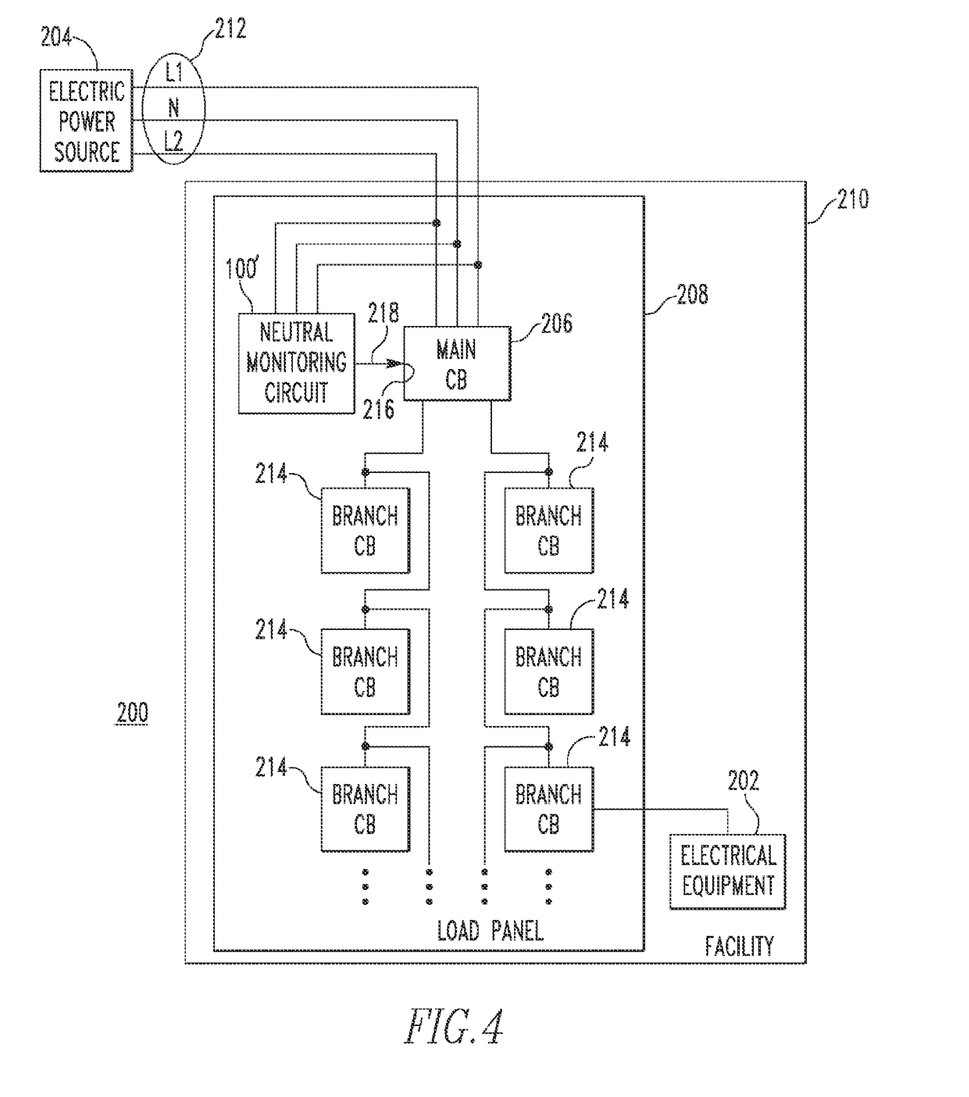
FIGS. 4-7 are block diagrams of power systems including a load panel and a monitoring circuit in accordance with other example embodiments of the disclosed concept.
Figure 5:
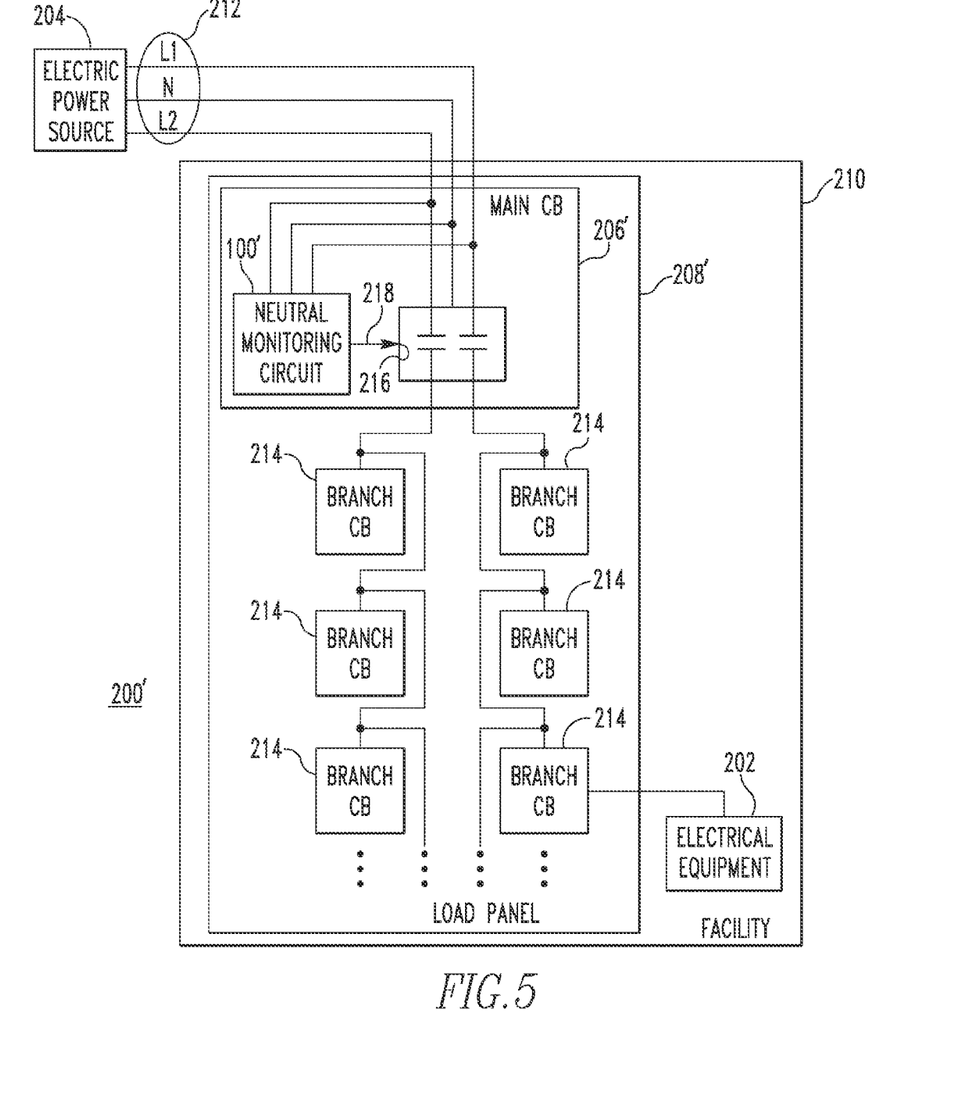

FIGS. 4 and 5 show examples of power systems 200,200' that protect all or part of a facility 210 from the possible damaging effects of, for example, a high impedance or missing neutral connection between, for example, a load center within the facility and an electric power supplier.

The power system 200 of FIG. 4 monitors for a broken or missing (e.g., damaged; disabled; high impedance) neutral connection condition to the electric power source 204 and takes protective action to isolate the power system 200 and associated electrical equipment, such as 202, from the electric power source 204, thereby protecting the electrical equipment from this condition. Generally, the system 200 includes a two-pole main circuit breaker (CB) 206 having shunt trip capability and the missing or broken neutral monitoring circuit 100'. In this example, the main circuit breaker 206 and the monitoring circuit 100' are in a facility load panel 208 that receives power from the electric power source 204 (e.g., without limitation, an electric power grid).

Power from the electric power source 204 is provided to the load panel 208 of the facility 210 over a number of electrical power cables 212, which include the first line L1, the second line L2 and the neutral N that form a split phase electrical distribution configuration. The load panel 208 includes the two-pole main circuit breaker 206, the monitoring circuit 100' and a number of branch circuit breakers 214 therein. One of the example branch circuit breakers 214 is for the electrical equipment 202, such as a suitable electrical load. The two-pole main circuit breaker 206 in the load panel 208 receives power from the first line L1, the second line L2 and the neutral N, and protects an unbalanced load powered by the load panel 208. The two-pole main circuit breaker 206 is structured to trip open responsive to a shunt trip input 216. The monitoring circuit 100' in the load panel 208 is structured to determine that the neutral N is broken or missing and responsively output over electrical connection 218 to the shunt trip input 216 to cause the main circuit breaker 206 to trip open. In this example, the monitoring circuit 100' in the load panel 208 is external to the two-pole main circuit breaker 206 in the load panel 208.

Alternatively, as shown in FIG. 5, a power system 200', which can be substantially the same as or similar to the power system 200 of FIG. 4, includes a load panel 208' having a two-pole main circuit breaker 206' with the monitoring circuit 100' therein. In this example, the monitoring circuit 100' in the load panel 208' is internal to the two-pole main circuit breaker 206' in the load panel 208', but otherwise functions in the same manner as does the monitoring circuit 100' of FIG. 4 to trip open the main circuit breaker 206' in response to a broken or missing neutral.

Figure 6:
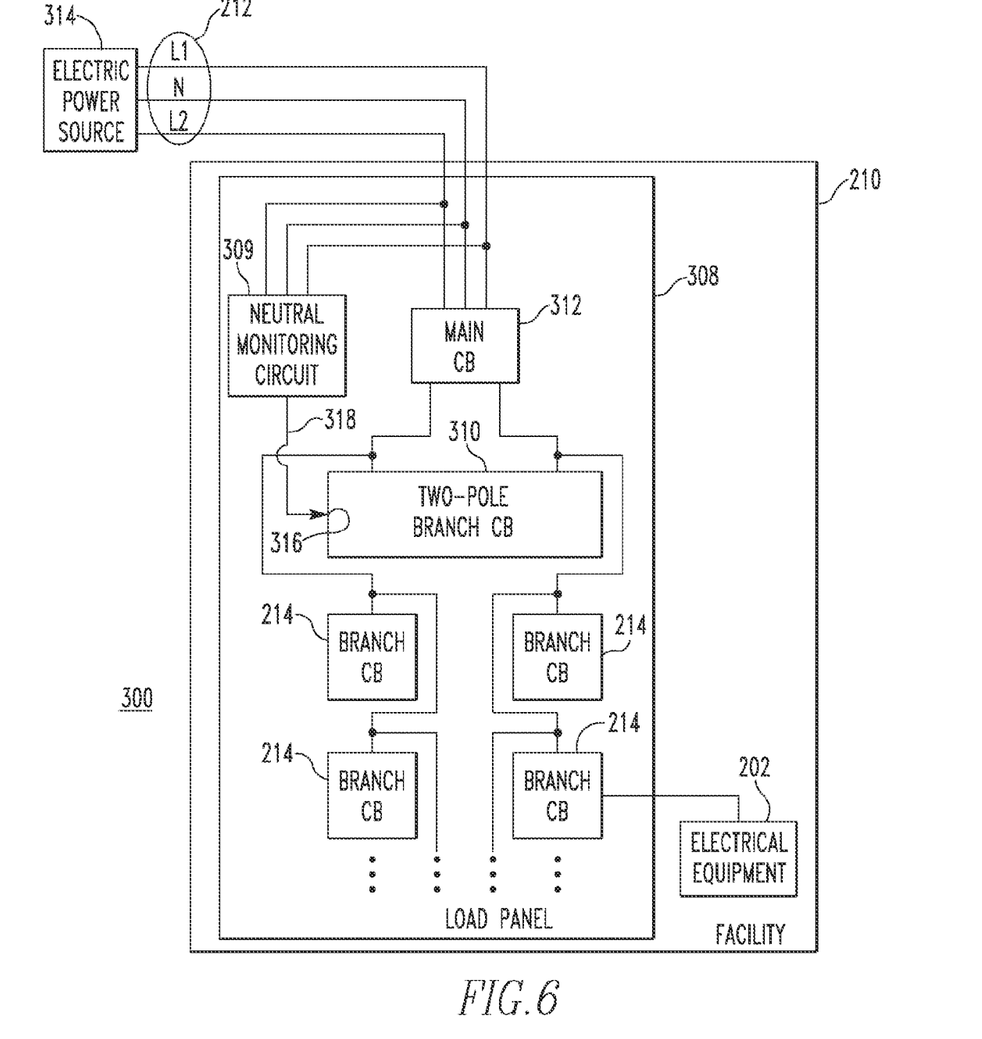

Referring to FIG. 6, a power system 300 can be substantially the same as or similar to the power system 200 of FIG. 4. In the power system 300, a facility load panel 308 can be substantially the same as or similar to the facility load panel 208 of FIG. 4, except that it includes a two-pole branch circuit breaker 310 that can isolate and protect a 220V or 240V branch circuit (e.g., without limitation, that powers an air conditioner (not shown)). The facility load panel 308 also includes a neutral monitoring circuit 309 that can be substantially the same as or similar to the neutral monitoring circuit 100' of FIGS. 3-5. Here, the monitoring circuit 309 is external to the two-pole branch circuit breaker 310 but is part of the facility load panel 308. The two-pole branch circuit breaker 310 has, for example, a shunt trip or remote control capability and responds to the signal from the monitoring circuit 309 to trip open or open the 220V or 240V branch circuit in the load panel 308 in the event, for example, of a high impedance or missing neutral connection, for example, between the two-pole branch circuit breaker 310 and a main circuit breaker 312, or between the two-pole branch circuit breaker 310 and the electric power source 314.

In this example, although not shown in FIG. 6, the main circuit breaker 312 can include the monitoring circuit 100' therein as shown with the main circuit breaker 206' of FIG. 5, can include the separate monitoring circuit 100' in the facility load panel 308 as shown with the power system 200 of FIG. 4, or can include no such monitoring circuit (as shown in FIG. 6). In the latter case, preferably all of the two-pole branch circuit breakers (only one two-pole branch circuit breaker 310 is shown in FIG. 6) in the facility load panel 308 include a corresponding monitoring circuit 309' therein (as shown in FIG. 7) or therewith (as shown with the monitoring circuit 309 of FIG. 6).

As shown in FIG. 6, the monitoring circuit 309 in the load panel 308 is structured to determine that the neutral N is broken or missing and responsively output over electrical connection 318 to the shunt trip or remote control input 316 to cause two-pole branch circuit breaker 310 to trip open or open.

Figure 7:
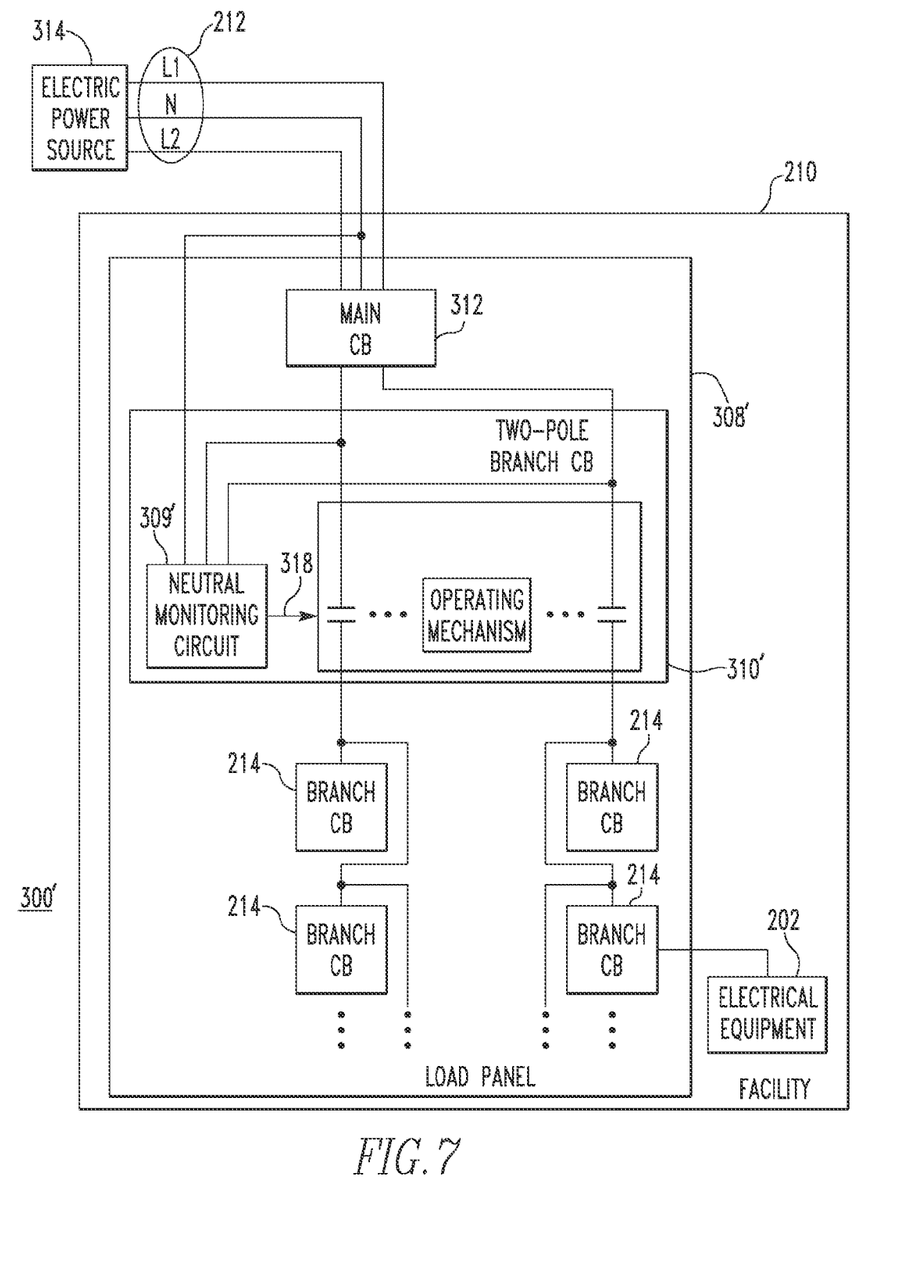

FIG. 7 shows a power system 300' that can be substantially the same as or similar to the power system 300 of FIG. 6, except that in this example, a neutral monitoring circuit 309' in load panel 308' is internal to two-pole branch circuit breaker 310' in the load panel 308'.

The disclosed concept employs the neutral monitoring circuit 100' to monitor the integrity of the neutral connection between, for example and without limitation, a power source and a load center of a facility, and to disconnect the facility from the power source when the neutral connection is broken or missing (e.g., has been compromised). It is believed that known current systems do not have this combination of these monitoring and protection functions.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A power system for a facility, said power system comprising:
   a load panel powered from a split phase electrical distribution configuration having a first line, a second line and a neutral;
   a two-pole circuit interrupter in said load panel receiving power from the first line, the second line and the neutral, and protecting an unbalanced load, said two-pole circuit interrupter being structured to trip open or open responsive to an input; and
   a circuit in said load panel structured to determine that the neutral is broken or missing and responsively output to said input to cause said two-pole circuit interrupter to trip open or open, wherein said circuit comprises:
a voltage divider including an input of a voltage difference between the first line and the second line, and an output, the voltage divider structured to divide the voltage difference and to output the divided voltage difference as a virtual neutral,
a rectifier including an input of the virtual neutral, the neutral, and an output, the rectifier structured to rectify a voltage difference between the virtual neutral and the neutral,
a determination circuit including an input of the rectified voltage difference, a reference voltage and an output, the determination circuit structured to determine if the neutral is missing or broken based on the rectified voltage difference and the reference voltage, and
an output circuit structured to output to the input of said two-pole circuit interrupter when the neutral is missing or broken based on the output of the determination circuit.

2. The power system of claim 1, wherein the output of the voltage divider is an average of a voltage of the first line and a voltage of the second line.

3. The power system of claim 1, wherein the voltage divider further includes a first resistance and a second resistance substantially equal to the first resistance; wherein the first resistance and the second resistance are electrically connected between the first line and the second line; and wherein the output of the voltage divider is provided from a point between the first resistance and the second resistance.

4. The power system of claim 1, wherein the determination circuit further includes a filter structured to filter the rectified voltage difference and a comparator structured to compare the filtered rectified voltage difference with the reference voltage; and wherein the determination circuit determines that the neutral is missing or broken when the filtered rectified voltage difference is greater than the reference voltage.

5. The power system of claim 4, wherein the filter further includes a resistance electrically connected between the output of the rectifier and a first input of the comparator and a capacitance electrically connected between the first input of the comparator and a ground.

6. The power system of claim 1, wherein the determination circuit further includes a reference voltage generator structured to generate the reference voltage; and wherein the reference voltage generator includes two resistances structured to divide a supply voltage to generate the reference voltage.

7. The power system of claim 1, wherein the reference voltage is in a range of about 2.5V to about 10V.

8. The power system of claim 1, wherein the rectifier is a full-wave rectifier.

9. The power system of claim 1, wherein a voltage of the first line is 180 degrees out of phase with a voltage of the second line.

10. A power system for a facility, said power system comprising:
a load panel powered from a split phase electrical distribution configuration having a first line, a second line and a neutral;
a two-pole circuit interrupter in said load panel receiving power from the first line, the second line and the neutral, and protecting an unbalanced load, said two-pole circuit interrupter being structured to trip open or open responsive to an input; and
a circuit in said load panel structured to determine that the neutral is broken or missing and responsively output to said input to cause said two-pole circuit interrupter to trip open or open, wherein said circuit comprises:
a power supply structured to use alternating current power from the first and second lines to create direct current power,
a voltage divider including an input of a voltage difference between the first line and the second line, and an output, the voltage divider structured to divide the voltage difference and to output the divided voltage difference as a virtual neutral,
a rectifier including an input of the virtual neutral, the neutral, and an output, the rectifier structured to rectify a voltage difference between the virtual neutral and the neutral,
a determination circuit including an input of the rectified voltage difference, a reference voltage and an output, the determination circuit structured to determine if the neutral is missing or broken based on the rectified voltage difference and the reference voltage, and
an output circuit structured to output to the input of said two-pole circuit interrupter when the neutral is missing or broken based on the output of the determination circuit.

11. The power system of claim 10, wherein the power supply is not electrically connected to the neutral.

12. The power system of claim 10, wherein the determination circuit is powered by the direct current power from the power supply.

13. The power system of claim 12, wherein the determination circuit further includes a reference voltage generator structured to generate the reference voltage; wherein the reference voltage generator receives a direct current supply voltage from the power supply; and wherein the reference voltage generator divides the direct current supply voltage to generate the reference voltage.

14. The power system of claim 1, wherein said two-pole circuit interrupter in said load panel is a two-pole main circuit interrupter in said load panel; and wherein said circuit in said load panel is external to said two-pole main circuit interrupter in said load panel.

15. The power system of claim 1, wherein said two-pole circuit interrupter in said load panel is a two-pole main circuit interrupter in said load panel; and wherein said circuit in said load panel is internal to said two-pole main circuit interrupter in said load panel.

16. The power system of claim 1, wherein said two-pole circuit interrupter in said load panel is a two-pole branch circuit interrupter in said load panel; and wherein said circuit in said load panel is external to said two-pole branch circuit interrupter in said load panel.

17. The power system of claim 1, wherein said two-pole circuit interrupter in said load panel is a two-pole branch circuit interrupter in said load panel; and wherein said circuit in said load panel is internal to said two-pole branch circuit interrupter in said load panel.

18. The power system of claim 1, wherein said two-pole circuit interrupter in said load panel is a two-pole main circuit interrupter in said load panel; and wherein the input of said two-pole main circuit interrupter is a shunt trip input that causes said two-pole main circuit interrupter to trip open responsive to the neutral being broken or missing.

19. The power system of claim 1, wherein said two-pole circuit interrupter in said load panel is a two-pole branch circuit interrupter in said load panel; and wherein the input of said two-pole branch circuit interrupter is a shunt trip input or a remote control input that causes said two-pole branch circuit interrupter to trip open or open, respectively, responsive to the neutral being broken or missing.

* * * * *